(12) United States Patent
Hsieh et al.

(10) Patent No.: US 9,305,860 B2
(45) Date of Patent: Apr. 5, 2016

(54) CYCLING HEAT DISSIPATION MODULE

(71) Applicant: Acer Incorporated, New Taipei (TW)

(72) Inventors: Cheng-Wen Hsieh, New Taipei (TW); Wen-Neng Liao, New Taipei (TW)

(73) Assignee: Acer Incorporated, New Taipei (TW)

( * ) Notice: Subject to any disclaimer, the term of this patent is extended or adjusted under 35 U.S.C. 154(b) by 166 days.

(21) Appl. No.: 14/261,392

(22) Filed: Apr. 24, 2014

(65) Prior Publication Data

US 2015/0020997 A1    Jan. 22, 2015

Related U.S. Application Data

(63) Continuation-in-part of application No. 14/098,486, filed on Dec. 5, 2013.

(30) Foreign Application Priority Data

Jul. 18, 2013  (TW) .............................. 102125778 A
Jul. 22, 2013  (TW) .............................. 102126131 A

(51) Int. Cl.
| | |
|---|---|
| H05K 7/20 | (2006.01) |
| H01L 23/473 | (2006.01) |
| H01L 23/427 | (2006.01) |
| G06F 1/20 | (2006.01) |

(52) U.S. Cl.
CPC .............. *H01L 23/473* (2013.01); *G06F 1/203* (2013.01); *H01L 23/427* (2013.01); *G06F 2200/201* (2013.01); *H01L 2924/0002* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ....................... 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 6,349,035 | B1 * | 2/2002 | Koenen ............... | H01L 23/4093 257/727 |
| 2004/0008487 | A1 * | 1/2004 | Hisano ............... | H05K 7/20254 361/690 |
| 2004/0011511 | A1 * | 1/2004 | Ghosh ................. | F28D 15/0266 165/104.21 |
| 2006/0254752 | A1 * | 11/2006 | Narakino .............. | F28D 1/0316 165/80.4 |
| 2007/0000648 | A1 * | 1/2007 | Crocker ................ | F04D 29/588 165/104.33 |
| 2007/0089859 | A1 * | 4/2007 | Wei .......................... | G06F 1/20 165/80.4 |
| 2007/0211426 | A1 * | 9/2007 | Clayton ................ | H01L 23/473 361/689 |
| 2007/0227709 | A1 * | 10/2007 | Upadhya ................... | G06F 1/20 165/121 |

(Continued)

*Primary Examiner* — Anthony Haughton
*Assistant Examiner* — Razmeen Gafur
(74) *Attorney, Agent, or Firm* — Jianq Chyun IP Office

(57) ABSTRACT

A cycling heat dissipation module is used for removing the heat generated by a heat-generating element of a circuit board and includes at least one main body and at least one conducting pipe. The main body has a chamber and a heat guiding part. The chamber is filled with a fluid and has a wall to divide the chamber into a first compartment and a second compartment adjacent to each other. The heat guiding part is used for conducting the heat generated from the heat generating element. The conducting pipe has a first end, a second end and a heat exchanging section. The fluid is pushed into the heat-exchanging section by the pressure difference after absorbing the heat of the heat guiding part, and then moved to the second compartment.

13 Claims, 9 Drawing Sheets

(56) References Cited

U.S. PATENT DOCUMENTS

| | | | | |
|---|---|---|---|---|
| 2007/0246193 A1* | 10/2007 | Bhatti | ............ | F28D 15/0233 |
| | | | | 165/104.21 |
| 2007/0246195 A1* | 10/2007 | Bhatti | ............ | F28D 15/02 |
| | | | | 165/104.33 |
| 2007/0295480 A1* | 12/2007 | Campbell | ............ | H01L 23/427 |
| | | | | 165/80.4 |
| 2008/0030956 A1* | 2/2008 | Silverstein | ............ | F28D 15/0266 |
| | | | | 361/700 |
| 2008/0209931 A1* | 9/2008 | Stevens | ............ | H05K 7/20763 |
| | | | | 361/699 |
| 2008/0236790 A1* | 10/2008 | Bhatti | ............ | F28D 15/0233 |
| | | | | 165/80.3 |
| 2008/0264604 A1* | 10/2008 | Campbell | ............ | F28F 3/02 |
| | | | | 165/80.4 |
| 2008/0291629 A1* | 11/2008 | Ali | ............ | G06F 1/203 |
| | | | | 361/700 |
| 2010/0039767 A1* | 2/2010 | Katada | ............ | F28F 3/12 |
| | | | | 361/679.53 |
| 2010/0277868 A1* | 11/2010 | Beaupre | ............ | H01L 23/473 |
| | | | | 361/700 |
| 2011/0176276 A1* | 7/2011 | Sarraf | ............ | F28D 15/02 |
| | | | | 361/705 |
| 2011/0226460 A1* | 9/2011 | Sommer | ............ | G06F 1/206 |
| | | | | 165/200 |
| 2011/0299244 A1* | 12/2011 | Dede | ............ | F28F 3/046 |
| | | | | 361/689 |
| 2011/0303403 A1* | 12/2011 | Holahan | ............ | H01L 23/4332 |
| | | | | 165/180 |
| 2011/0304979 A1* | 12/2011 | Peterson | ............ | G06F 1/20 |
| | | | | 361/679.47 |
| 2012/0281359 A1* | 11/2012 | Arney | ............ | H05K 7/20645 |
| | | | | 361/701 |
| 2013/0044432 A1* | 2/2013 | Ogata | ............ | H05K 7/20336 |
| | | | | 361/700 |

* cited by examiner

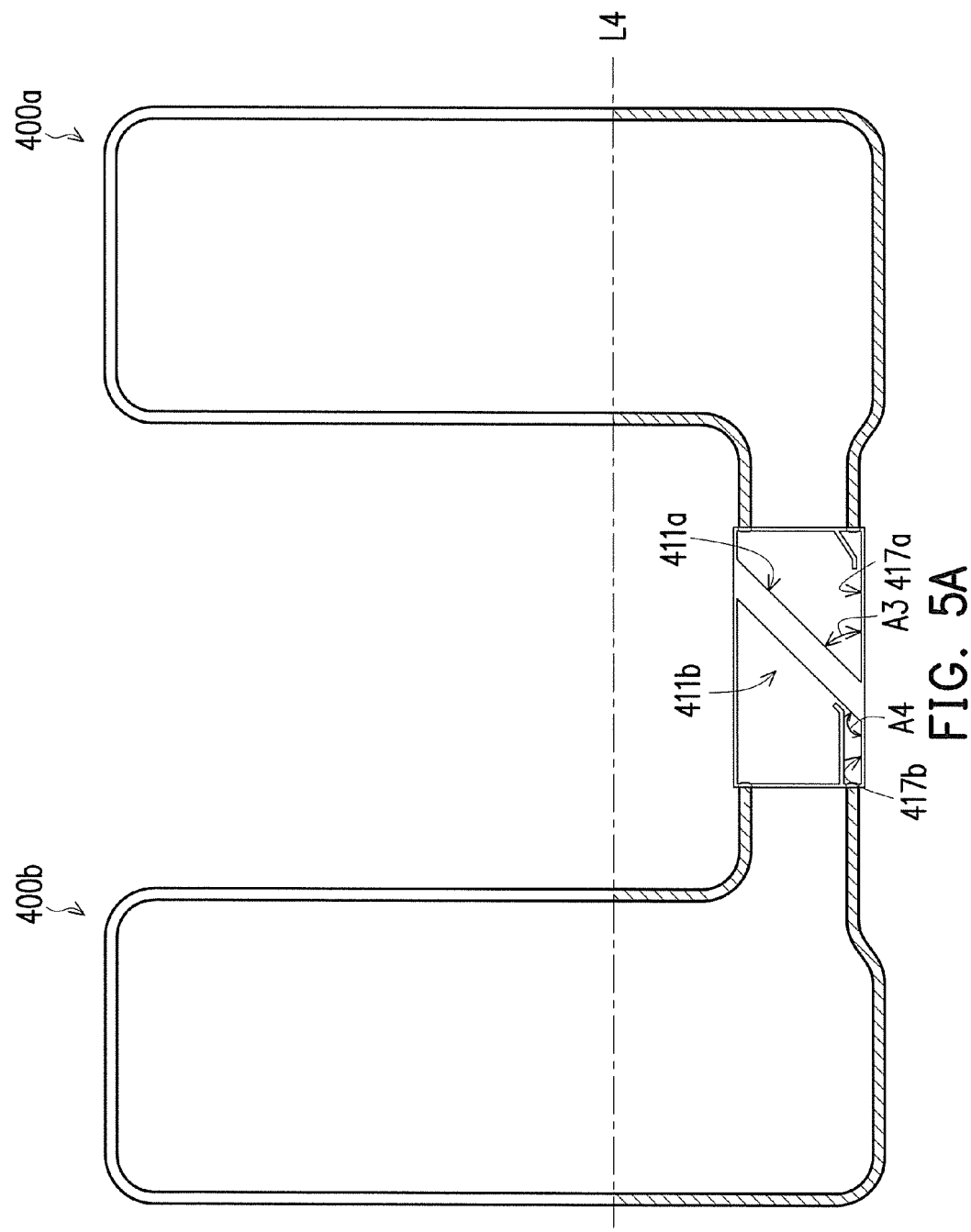

CYCLING HEAT DISSIPATION MODULE

CROSS-REFERENCE TO RELATED APPLICATION

This application is a continuation-in-part application of and claims the priority benefit of U.S. application Ser. No. 14/098,486, filed on Dec. 5, 2013, now pending, which claims the priority benefit of Taiwan application serial no. 102125778, filed on Jul. 18, 2013. This continuation-in-part application also claims the priority benefit of Taiwan application no. 102126131, filed on Jul. 22, 2013. The entirety of each of the above-mentioned patent applications is hereby incorporated by reference herein and made a part of this specification.

BACKGROUND OF THE INVENTION

1. Field of the Invention

The invention is related to a cycling heat dissipation module, and more particularly, to a cycling heat dissipation module that absorbs heat by using fluid.

2. Description of Related Art

As technology advances, portable electronic devices have been trending to be thinner and lighter. For example, notebook computers, tablet PCs, and smart phones that are thinner and lighter are more convenient to be carried around and operated on. Taking a tablet PC for example, a tablet PC has the features of being small and light, which is convenient for a user to use as a portable device. In order to improve the processing efficiency of the tablet PC, the efficiency of the central processor of the motherboard is also raised. When the central processor is executing a higher requirement operation, a large amount of heat energy is generated. In order to prevent the heat energy from affecting the central processor, a heat dissipation system will be disposed within a tablet PC, so as to remove the heat generated by the heat generating units.

In general, heat dissipation systems include air-cooled dissipation systems and water-cooled dissipation systems. Water-cooled dissipation systems have better efficiency. Water-cooled cycling heat dissipation modules use a thermal contact to directly contact the back side of a heating emitting unit (such as the central processing unit). A coolant pipe is used to correspondingly connect to the thermal contact and the inner pipes of a heat exchanger. This way, the heat energy transfers from the cycling heat dissipation module to the heat exchanger, achieving the goal of water cooling. However, as there are now more and more restrictions to the space allowed in a tablet PC; a heat exchanger is too large, and is not suitable in a tablet PC. Thus, how to dispose a water-cooled heat dissipation system in limited space has become an important topic.

SUMMARY OF THE INVENTION

The invention provides a cycling heat dissipation module that uses fluid to absorb heat generated by a heat generating element. After the fluid is cooled away from the heat generating element, it is then flowed back to the cycling heat dissipation module.

The cycling heat dissipation module is used to remove the heat generated by a heat generating element of a circuit board. The cycling heat dissipation module includes at least one main body and at least one conducting pipe. The main body includes a chamber and a heat guiding part, respectively located inside the main body. The chamber is filled with fluid and has a wall to divide the chamber into a first compartment and a second compartment adjacent with each other. The first compartment has a first outlet, and the second compartment has a first inlet. The fluid is suitable for permeating through the wall and flowing between the first compartment and the second compartment. At least one first side wall of the chamber is contacted with the heat guiding part, wherein the heat guiding part is used for conducting the heat generated from the heat generating element. The conducting pipe includes a first end, a second end and a heat exchanging section. The first end is connected to the first outlet, and the second end is connected to the first inlet. The heat exchanging section connects the first end and the second end. After the fluid in the first compartment has absorbed the heat conducted from the first side wall, the fluid is pushed into the heat exchanging section through the first outlet by a pressure difference. After the fluid is cooled, it is then pushed back into the second compartment by a pressure difference.

Based on the above, in the cycling heat dissipation module of the invention, the fluid flows in the chamber of the main body. The heat guiding part of the main body can absorb the heat generated from a heat generating element, and conduct the heat to the fluid. After the fluid absorbs the heat generated from the heat generating element, the fluid is evaporated and exits the main body from the first outlet of the first compartment and enters the heat exchanging section. After the fluid is cooled in the heat exchanging section, it is then returned to the main body by flowing into the second compartment through the first inlet. Thus, the heat dissipating apparatus of the invention can reduce the volume of a water-cooled heat dissipating system, so as to be more suitable for a thinner notebook computer or tablet PC.

To make the above features and advantages of the invention more comprehensible, several embodiments accompanied with drawings are described in detail as follows.

BRIEF DESCRIPTION OF THE DRAWINGS

FIG. 5A is a schematic cross-sectional view of a cycling heat dissipation module according to another embodiment of the invention.

DESCRIPTION OF EMBODIMENTS

Figure 1A:
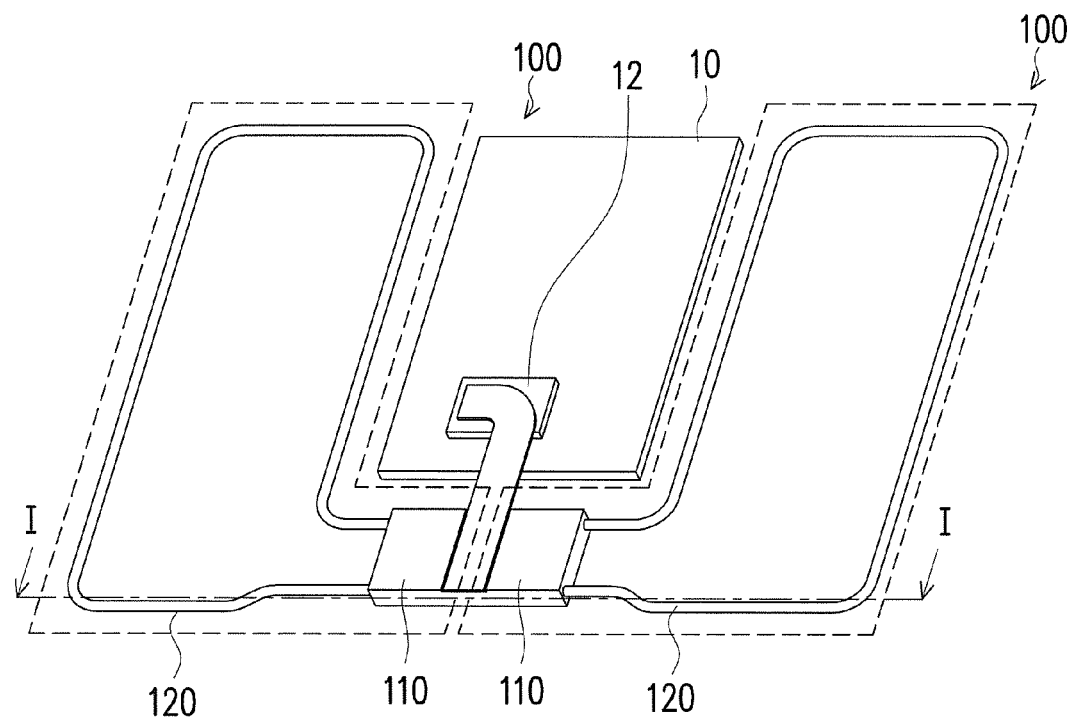
FIG. 1A is a schematic view of a cycling heat dissipation module according to an embodiment of the invention.
Figure 1B:
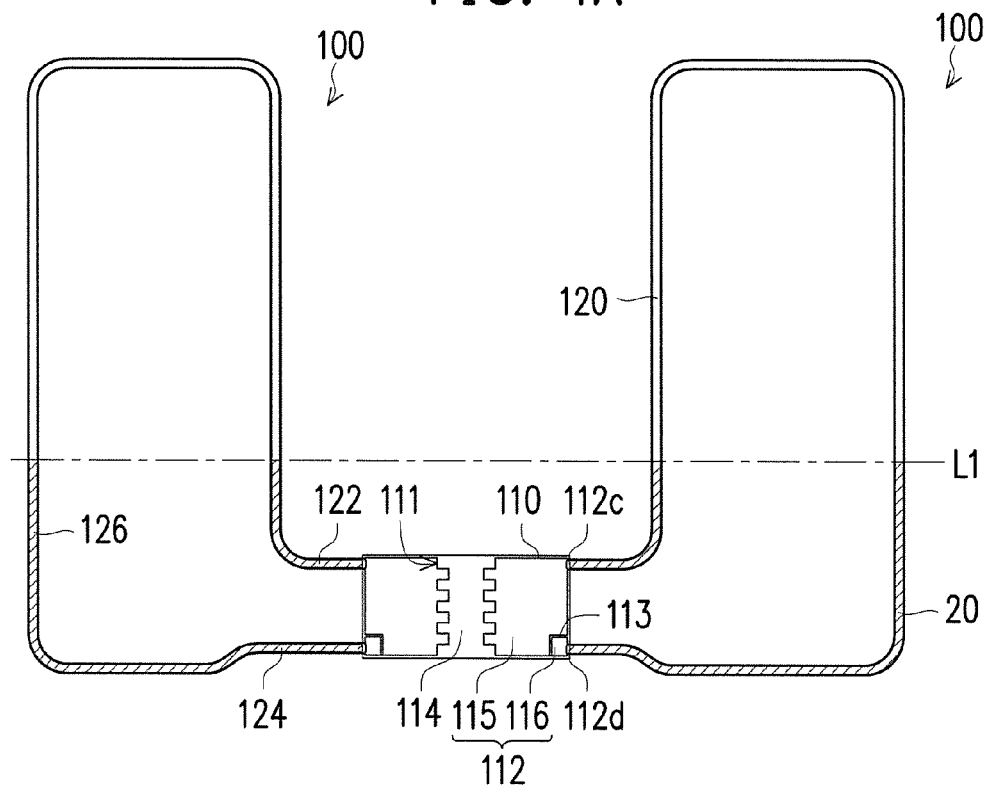
FIG. 1B is a schematic cross-sectional view taken along line I-I in FIG. 1A.
Figure 1C:
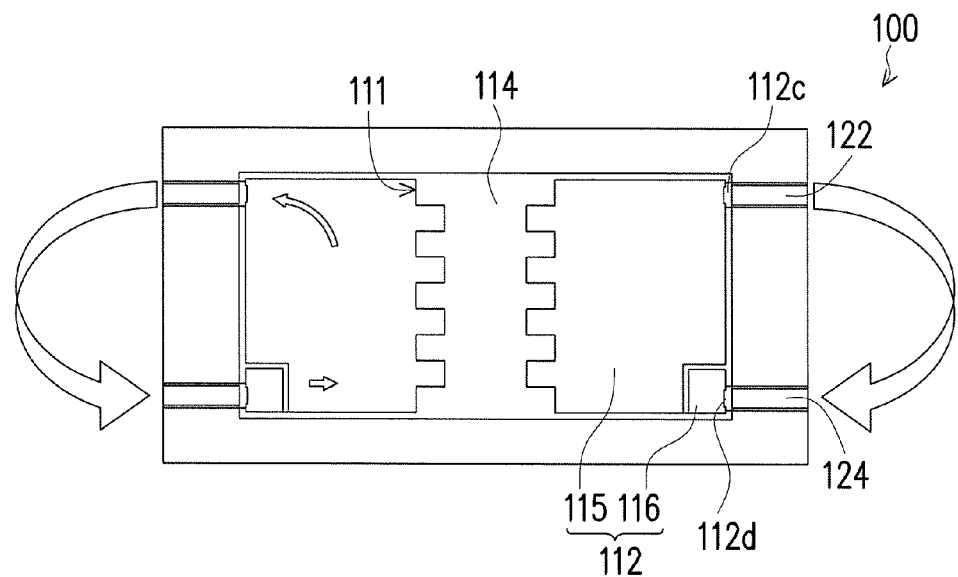
FIG. 1C is an enlarged partial view of FIG. 1B.

FIG. 1A is a schematic view of a cycling heat dissipation module according to an embodiment of the invention. FIG. 1B is a schematic cross-sectional view taken along line I-I in FIG. 1A. FIG. 1C is an enlarged partial view of FIG. 1B. Referring to FIG. 1A, FIG. 1B, and FIG. 1C, the cycling heat dissipation module 100 of the embodiment is used to remove the heat generated by a heat generating element 12 of a circuit board 10. The cycling heat dissipation module 100 includes at least one main body 110 and at least one conducting pipe 120. The main body 110 includes a chamber 112 and a heat guiding part 114, respectively located inside the main body 110. The chamber 112 is filled with fluid 20 and has a wall 113 to divide the chamber 112 into a first compartment 115 and a second compartment 116 adjacent with each other. The first compartment 115 has a first outlet 112c, and the second compartment 116 has a first inlet 112d. The fluid 20 is suitable for permeating through the wall 113 and flowing between the first compartment 115 and the second compartment 116. At least one first side wall 111 of the chamber 112 is contacted with the heat guiding part 114, wherein the heat guiding part 114 is used for conducting the heat generated from the heat generating element 12.

The conducting pipe 120 includes a first end 122, a second end 124 and a heat exchanging section 126. The first end 122 is connected to the first outlet 112c, and the second end 124 is connected to the first inlet 112d. The heat exchanging section 126 connects the first end 122 and the second end 124. After the fluid 20 in the first compartment 115 has absorbed the heat conducted from the first side wall 111, the fluid 20 is pushed into the heat exchanging section 126 through the first outlet 112c by a pressure difference. After the fluid 20 is cooled, it is then pushed back into the second compartment 116 by a pressure difference, and then permeates through the wall 113 to enter the first compartment 115.

The cycling heat dissipation module 100 of the embodiment is applied on a circuit board 10 of a tablet PC type electronic device. The heat generating element 12 of the circuit board 10 is, for example, a central processing unit (CPU). The wall 113 disposed in the chamber 112, and between the first compartment 115 and the second compartment 116 is composed of heat conductive porous material. The wall 113 made of porous material can allow the fluid 20 to permeate through, so as to flow between the first compartment 115 and the second compartment 116. In the embodiment, the porous material is, for example, sintered metal powder, etched metal, weaved metal, or weaved non-metal fiber. The invention is not limited thereto.

Further referring to FIG. 1B and FIG. 1C, in the cycling heat dissipation module 100 of the embodiment, as the chamber 112 corresponds to the conducting pipe 120, the heat exchanging section 126 is connected to the first end 122 and the second 124, and is away from the circuit board 10. The heat exchanging section 126 can be away from the circuit board 10 and close to the periphery of the electronic device. When the fluid 20 absorbs the heat generated from the heat generating element 12, the fluid 20 is evaporated and exits the main body 110 from the first outlet 112c of the first compartment 115 and enters the heat exchanging section 126. After the fluid 20 is cooled in the heat exchanging section 126, it is then returned to the main body 110 by flowing into the second compartment 116 through the first inlet 112d. The fluid 20 then permeates through the wall 113 to enter the first compartment 115 and continue to absorb heat. Thus, the volume of the heat dissipating apparatus 100 of the invention can be reduced since additional external heat dissipation holes are not required. This way the heat dissipating apparatus 100 is more suitable for a thinner notebook computer or tablet PC. In addition, the cycling heat dissipation module 100 of the embodiment uses the fluid 20 to absorb the heat transmitted to the heat guiding part 114, and then evaporate the fluid 20 to create a fluid cycle. This further reduces the noise problem of heat dissipation.

In FIG. 1A and FIG. 1B, in order to increase the heat dissipation efficiency, multiple cycling heat dissipation modules 100 can be symmetrically configured to form a heat dissipation system. This way, the electronic device can have efficient heat dissipation under different operations. However, the invention does not limit the shape and the configuration of the cycling heat dissipation modules 100. For example, in another embodiment that is not depicted of the invention, when a plurality of cycling heat dissipation modules are set up, the cycling in the chamber and the conducting pipe of these cycling heat dissipation modules 100 are independent. The arrangement of the chambers of the cycling heat dissipation modules can be arranged in parallel, intersecting, in the shape of a window, or having multiple sides, and is not limited to the parallel arrangement shown in the drawings. The following provides another embodiment to describe a variation in the application of the embodiment of FIG. 1A.

Figure 2A:
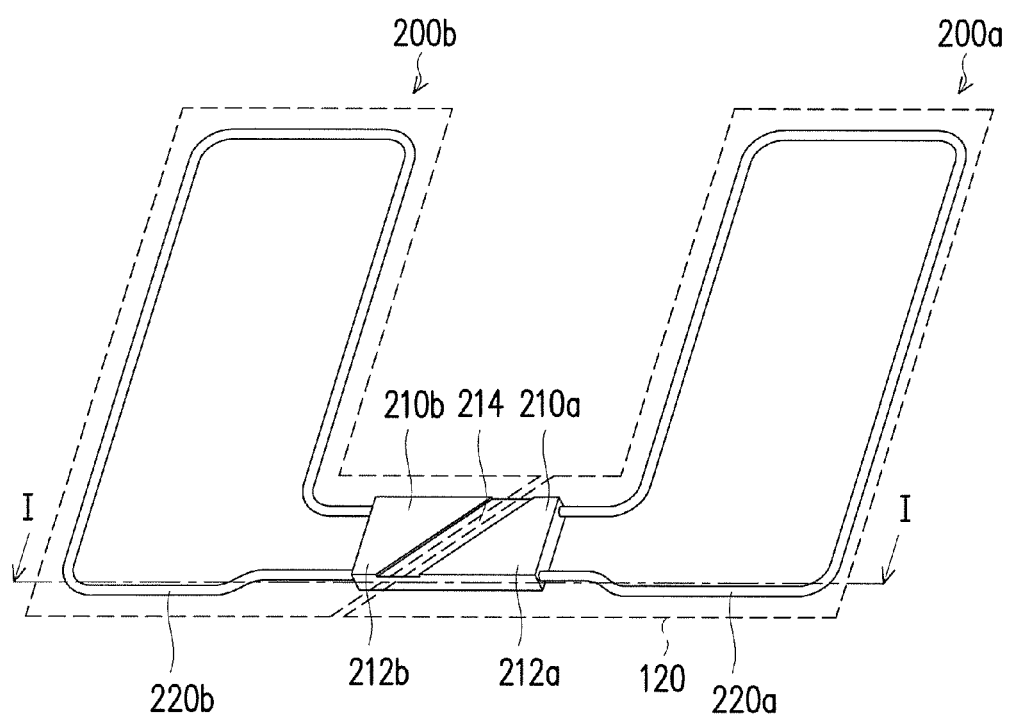
FIG. 2A is a schematic view of a cycling heat dissipation module according to another embodiment of the invention.
Figure 2B:
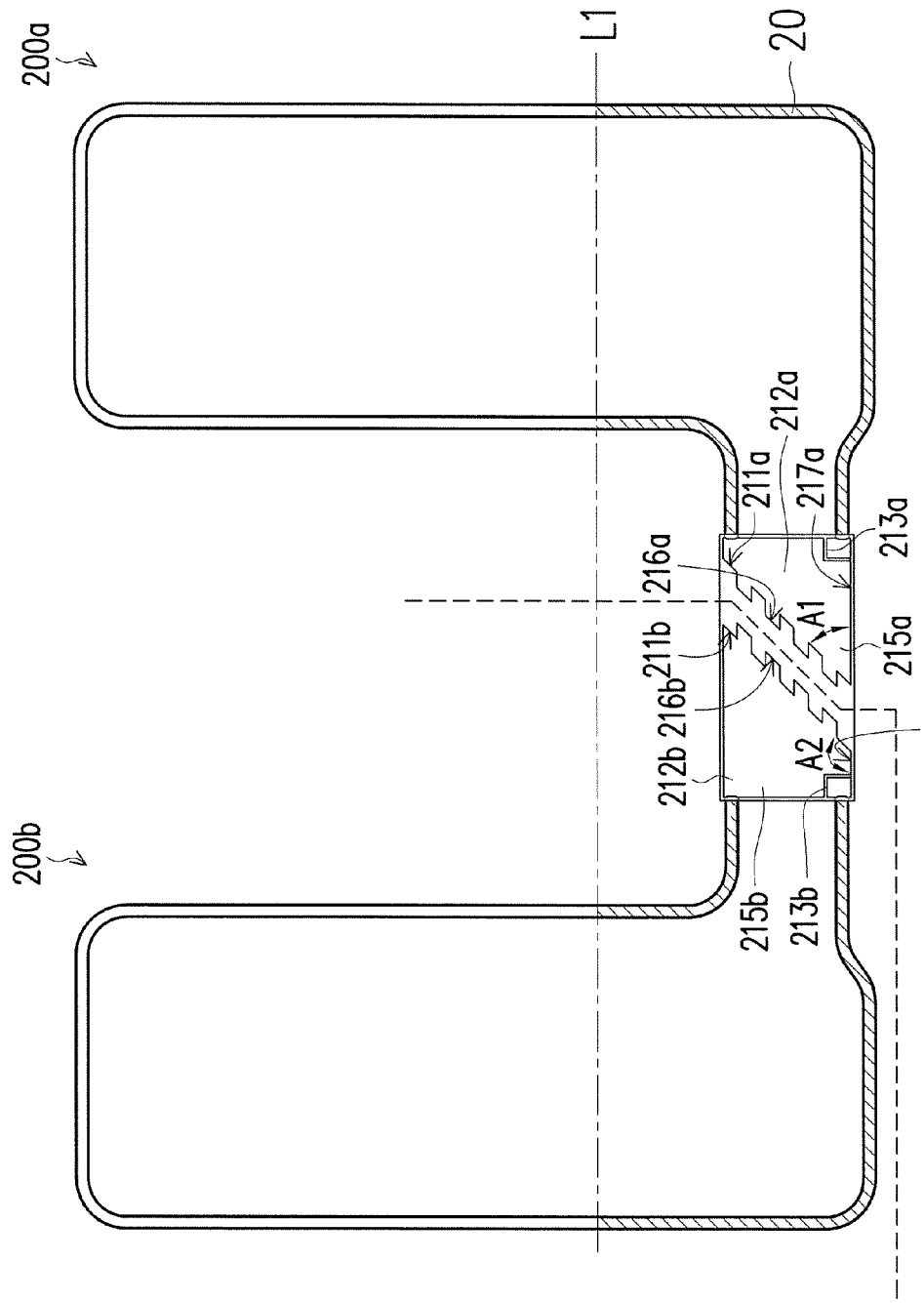
FIG. 2B is a schematic cross-sectional view taken along line I-I in FIG. 2A.
Figure 2C:
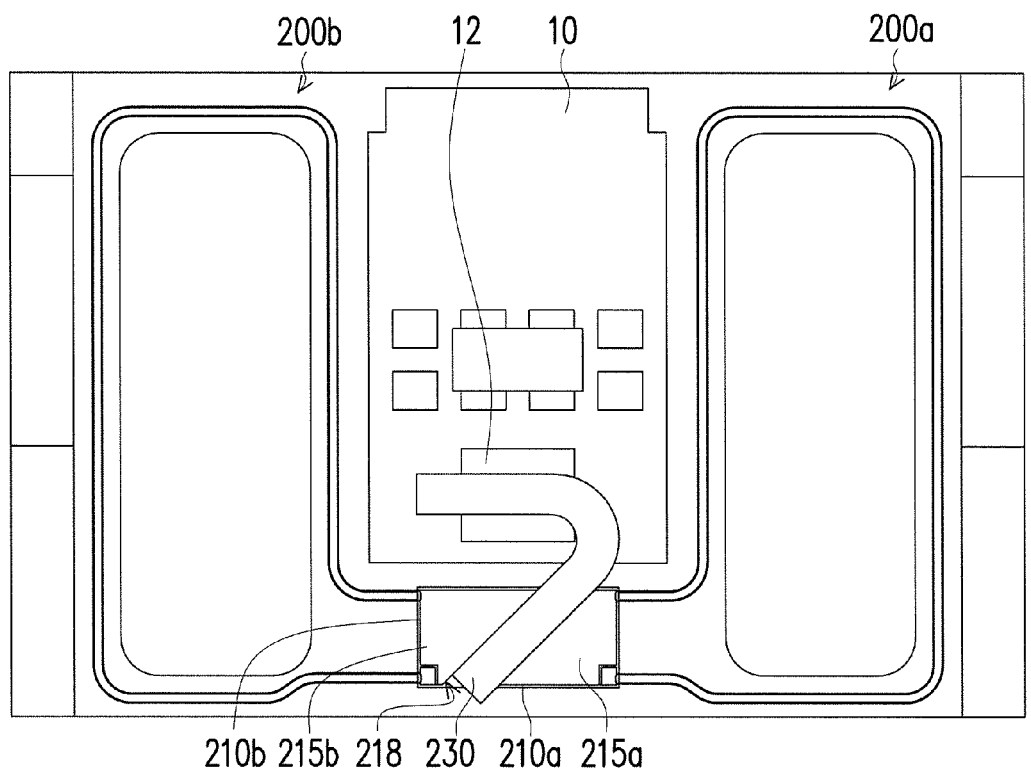
FIG. 2C is a schematic view of the cycling heat dissipation module of FIG. 2A disposed in an electronic device.

FIG. 2A is a schematic view of a cycling heat dissipation module according to another embodiment of the invention. FIG. 2B is a schematic cross-sectional view taken along line I-I in FIG. 2A. FIG. 2C is a schematic view of the cycling heat dissipation module of FIG. 2A disposed in an electronic device. Please refer to FIG. 2A to FIG. 2C. In the embodiment, the walls 213a and 213b have the same material as the embodiment shown in FIG. 1A, and will not be repeated hereinafter. The electronic device performs heat dissipation through a heat dissipation system made up of two complimentary cycling heat dissipation modules 200a, 200b. In detail, as seen in FIG. 2B, the cycling heat dissipation modules 200a, 200b are arranged in parallel. A first side wall 211a of the cycling heat dissipation module 200a and a bottom side wall 217a of the chamber 212a connected with the first side wall 211a form an angle A1. The angle A1 is an acute angle. Comparatively, in the cycling heat dissipation module 200b complimenting the cycling heat dissipation module 220a, a first side wall 211b and a bottom side wall 217b of the chamber 212b connected with the first side wall 211b form an angle A2. The angle A2 of the cycling heat dissipation module 200b is an obtuse angle.

Referring to FIG. 2B and FIG. 2C, in the embodiment, the first side walls 211a, 211b of the cycling heat dissipation modules 200a, 200b, respectively include a plurality of trenches 216a, 216b. The trenches 216a, 216b are located below the heat guiding part 214 and are communicated with the first compartments 215a, 215b. In other words, the trenches 216a, 216b extend into two sides below the heat guiding part 214. This arrangement and positioning allows the fluid 20 to flow below the heat guiding part 214 and raise heat dissipation efficiency. In addition, the cycling heat dissipation modules 200a, 200b further include an extension element 230. The heat guiding part 214 includes a concave 218 to contain the extension element 230. The extension element 230 contacts the heat generating element 12, so that the heat generated from the heat generating element 12 is conducted to the heat guiding part 214.

For example, in FIG. 2A and FIG. 2C, the cycling heat dissipation modules 200a, 200b both form the heat guiding part 214 and commonly use a single extension element 230. A concave of the heat guiding part 214 of the cycling heat dissipation modules 200a, 200b is also formed by both of the cycling heat dissipation modules 200a, 200b, and the extension element 230 is contained in the concave. In other words, the cycling heat dissipation modules 200a, 200b can contact the heat generating element 12 by way of the extension element 230 extending from the main bodies 210a, 210b, such that it's not necessary for the cycling heat dissipation modules 200a, 200b being disposed on the circuit board 10, and the flexibility in configuring the space within the electronic device is increasing. In the embodiment, the extension element 230 and the main bodies 210a, 210b are different components connected to each other. However, the invention is not limited thereto. In another embodiment of the invention not shown in the drawings, the main bodies and the extension element can be one component formed together. The material of the main bodies 210a, 210b of the cycling heat dissipation modules 200a, 200b can be metal, manufactured by way of die-casting. However, the invention is not limited thereto.

Figure 3:
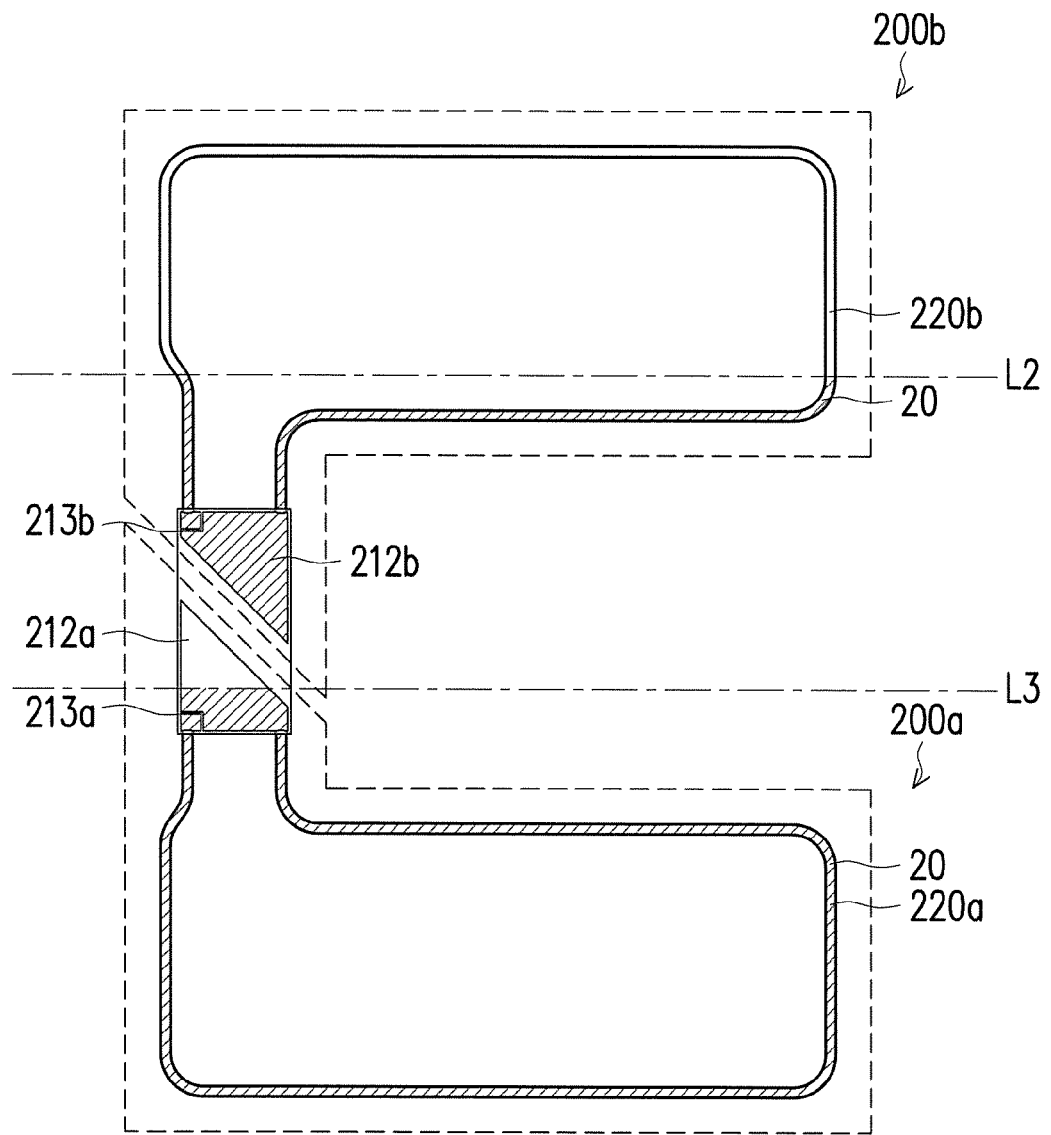
FIG. 3 is a schematic view of the cycling heat dissipation module of FIG. 2C in use.

FIG. 3 is a schematic view of the cycling heat dissipation module of FIG. 2C in use. Referring to FIG. 2B and FIG. 3, in FIG. 2B, the liquid line L1 shows the liquid height of the fluid 20 respectively filling the cycling heat dissipation modules 200a, 200b. When the cycling heat dissipation modules 200a, 200b are horizontal (as shown in FIG. 2B), the fluid 20 fills the main body and part of the conducting pipes 220a, 220b. This ensures that the fluid 20 can undergo a one way cycle in gas-liquid manner. In the embodiment, the volume of the fluid 20 is over 30% of the total volume of the chamber 212a, 212b and the conducting pipe 220a, 220b. Preferably, the volume of the fluid 20 is 50% of the total volume of the chamber 212a, 212b and the conducting pipe 220a, 220b. However, the invention is not limited thereto.

The amount filled by the fluid 20 can further ensure that when the cycling heat dissipation modules 200a, 200b are rotated to be upright as shown in FIG. 3, such as when the electronic device is being vertically used, the liquid lines L2, L3 of the fluid 20 in the chamber 212a, 212b respectively covers the walls 213a, 213b of the chambers 212a, 212b. In other words, fluid 20 at a lower region can continuously fill the corresponding conducting pipe 220a, and the liquid line L3 of the fluid 20 is higher than the wall 213a. This allows the fluid 20 in the chamber 212a to be evaporated by absorbing the heat of the heat guiding part 214 from the heat generating element 12, and enter the conducting pipe 220a for cooling.

Figure 4A:
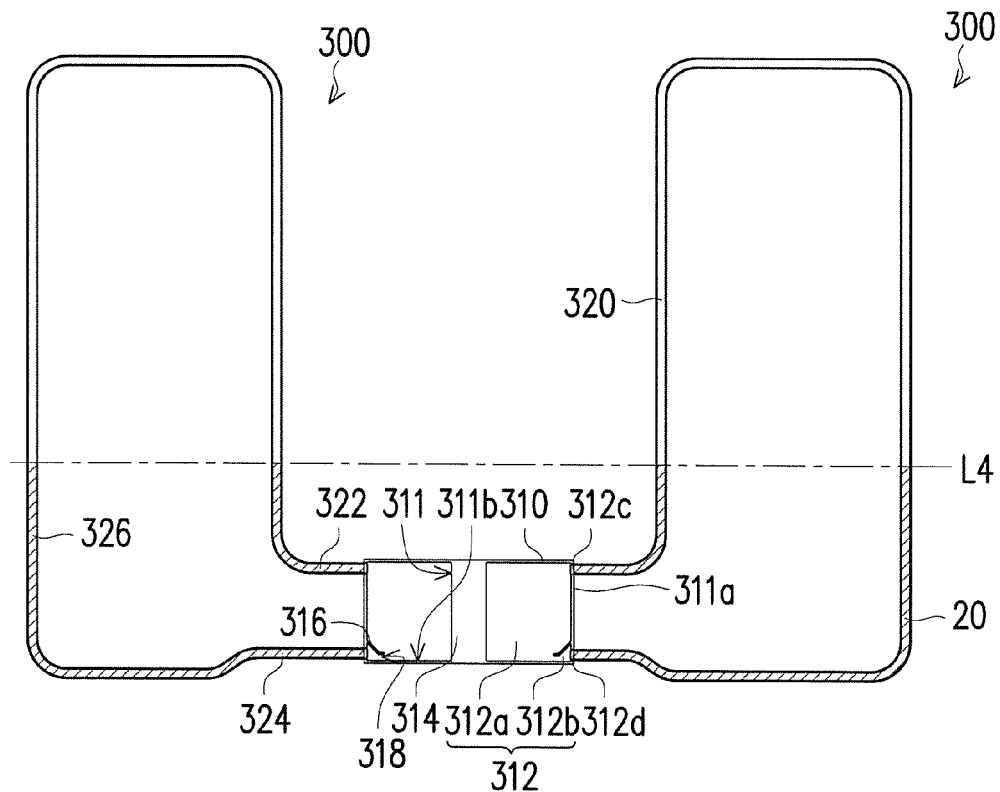
FIG. 4A is a schematic cross-sectional view of a cycling heat dissipation module according to another embodiment of the invention.
Figure 4B:
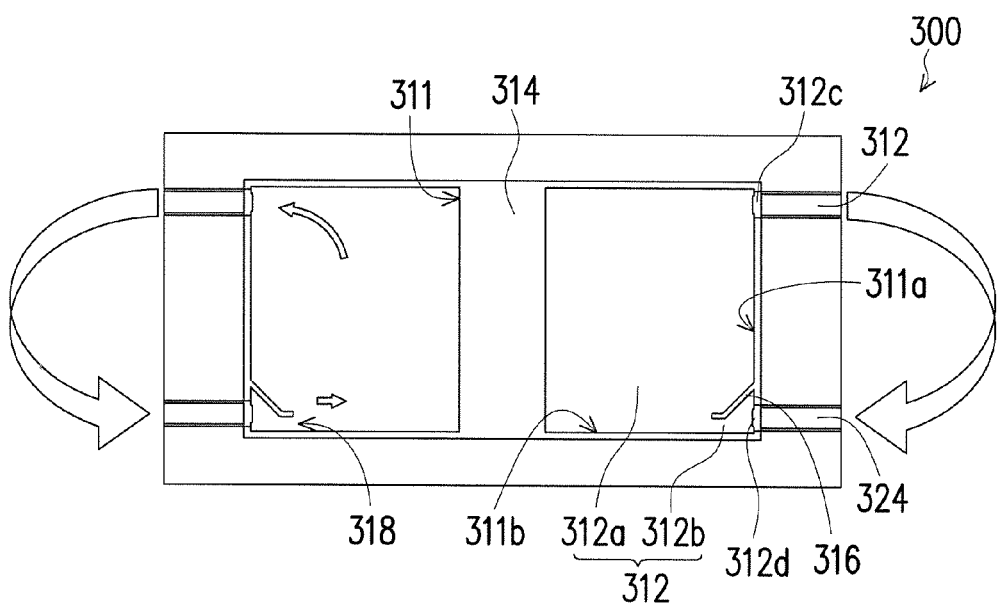
FIG. 4B is an enlarged partial view of FIG. 4A.

FIG. 4A is a schematic cross-sectional view of a cycling heat dissipation module according to another embodiment of the invention. The three-dimensional view can be referred to in FIG. 1A. FIG. 4B is an enlarged partial view of FIG. 4A. Referring to FIG. 4A and FIG. 4B, the cycling heat dissipation module 300 of the embodiment is used to remove the heat generated by a heat generating element 12 of a circuit board 10. The cycling heat dissipation module 300 includes at least one main body 310 and at least one conducting pipe 320. The main body 310 includes a chamber 312 and a heat guiding part 314, respectively located inside the main body 310. The chamber 312 is filled with fluid 20 and has a wall 316 to divide the chamber 312 into a first compartment 312a and a second compartment 312b communicated with each other. The first compartment 312a has a first outlet 312c, and the second compartment 312b has a first inlet 312d. The fluid 20 is suitable for flowing between the first compartment 312a and the second compartment 312b. At least one first side wall 311 of the chamber 312 is contacted with the heat guiding part 314, wherein the heat guiding part 314 is used for conducting the heat generated from the heat generating element 12.

The conducting pipe 320 includes a first end 322, a second end 324 and a heat exchanging section 326. The first end 322 is connected to the first outlet 312c, and the second end 324 is connected to the first inlet 312d. The heat exchanging section 326 connects the first end 322 and the second end 324. After the fluid 20 has absorbed the heat conducted from the first side wall 311, the fluid 20 is pushed into the heat exchanging section 326 of the conducting pipe 320 through the first outlet 312c by a pressure difference. After the fluid 20 is cooled, it is then pushed back into the second compartment 312b through the first inlet 312d by a pressure difference.

Further referring to FIG. 4A and FIG. 4B, the cycling heat dissipation module 300 of the embodiment is applied on a circuit board 10 of a tablet PC type electronic device (please refer to FIG. 1A). The heat generating element 12 of the circuit board 10 is, for example, a central processing unit (CPU). The heat exchanging section 326 can be away from the circuit board 10 and close to the periphery of the electronic device. In the chamber 312, the wall 316 protrudes from a second side wall 311a of the chamber 312, so as to divide the chamber 312 into a first compartment 312a and a second compartment 312b communicated with each other. In addition, in the cycling heat dissipation module 300, the wall 316 of the chamber 312 not only divides the chamber 312 into the first compartment 312a and the second compartment 312b, but also makes up a narrow channel 318 with the chamber 312. Furthermore, in order to restrict the flowing direction of the fluid 20, the fluid 20 is prevented from flowing from the first compartment 312a to the second compartment 312b. At a location in the second compartment 312b close to the narrow channel 318, the cross sectional area of the second compartment 312b has a gradually shrinking design. As the second compartment 312b is closer to the narrow channel 318, the cross sectional area becomes smaller, increasing the flow velocity of the fluid 20. In the embodiment, the side wall which forms a part of the narrow channel 318 with the wall 316 can be a side wall of the main body 310 or the heat guiding part 314. For example, in the cycling heat dissipation module 300, the wall 316 and a bottom side wall 311b both make up the narrow channel 318. However, the invention is not limited thereto.

When the heat of the heat generating element 12 is conducted to the heat guiding part 314, the fluid 20 in the chamber 312 can absorb the heat conducted by the heat guiding part 314. After the fluid 20 is vaporized, it enters the heat exchanging section 326 of the conducting pipe 320 through the first outlet 312c. After the fluid 20 is condensed into liquid, it then flows into the second compartment 312b through the first inlet 312d. Thus, the volume of the cycling heat dissipating apparatus 300 of the embodiment is reduced by not requiring additional heat dissipation holes, so as to be more suitable for a thinner notebook computer or tablet PC. In addition, the cycling heat dissipation module 300 of the embodiment uses the fluid 20 to absorb the heat transmitted to the heat guiding part 314, and then evaporate the fluid 20 to create a fluid cycle. This further reduces the noise problem of heat dissipation.

Figure 5B:
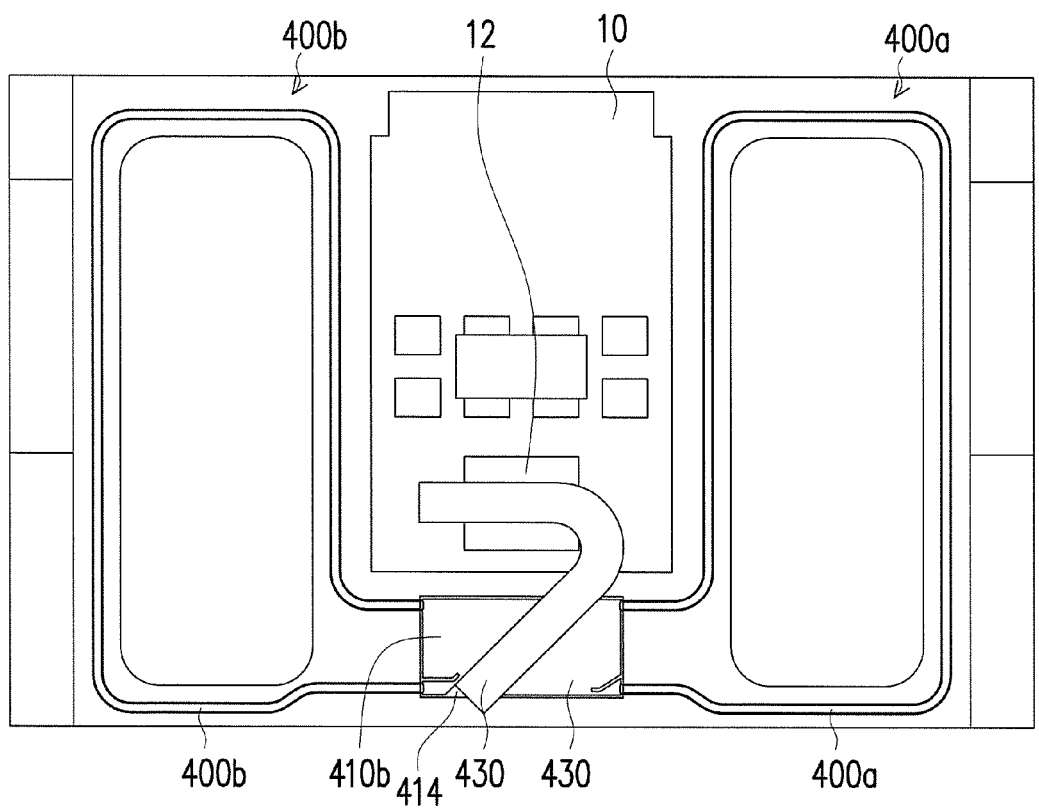
FIG. 5B is a schematic view of the cycling heat dissipation module of FIG. 5A disposed in an electronic device.

FIG. 5A is a schematic cross-sectional view of a cycling heat dissipation module according to another embodiment of the invention. The three-dimensional view can be referred to in FIG. 2A. FIG. 5B is a schematic view of the cycling heat dissipation module of FIG. 5A disposed in an electronic device. Please refer to FIG. 5A and FIG. 5B. In the embodiment, the walls 413a, 413b have the same material as the embodiment shown in FIG. 4A, and will not be repeated hereinafter. The electronic device performs heat dissipation through a heat dissipation system made up of two cycling heat dissipation modules 400a, 400b. In detail, as seen in FIG. 5B, a first side wall 411a of the cycling heat dissipation module 400a and the bottom side wall 417a of the chamber 412a connected with the first side wall 411 a form an angle A3. The angle A3 is an acute angle. Relative to the cycling heat dissipation module 400a, a first side wall 411b of the complementary heat dissipation module 400b and a bottom side wall 417b form an angle A4. The angle A4 of the cycling heat dissipation module 400b is an obtuse angle.

In FIG. 5B, the cycling heat dissipation modules 400a, 400b both form the heat conducting pipe 414 and use a common extension element 430. A concave of the heat guiding part 414 of the cycling heat dissipation modules 400a, 400b is also formed by both of the cycling heat dissipation modules 400a, 400b. The extension element 430 is contained in the concave. In other words, the cycling heat dissipation modules 400a, 400b can contact the heat generating element 12 by way of the extension element 430 extending from the main bodies 410a, 410b, such that it's not necessary for the cycling heat dissipation modules 400a, 400b being disposed on the circuit board 10, thus increasing the flexibility in configuring the space within the electronic device. In the embodiment, the extension element 430 and the main bodies 410a, 410b are different components connected to each other. However, the invention is not limited thereto. In another embodiment of the invention not shown in the drawings, the main bodies and the extension element can be one component formed together. The material of the main bodies 410a, 410b of the cycling heat dissipation modules 400a, 400b can be metal, manufactured by way of die-casting. However, the invention is not limited thereto.

Figure 6:
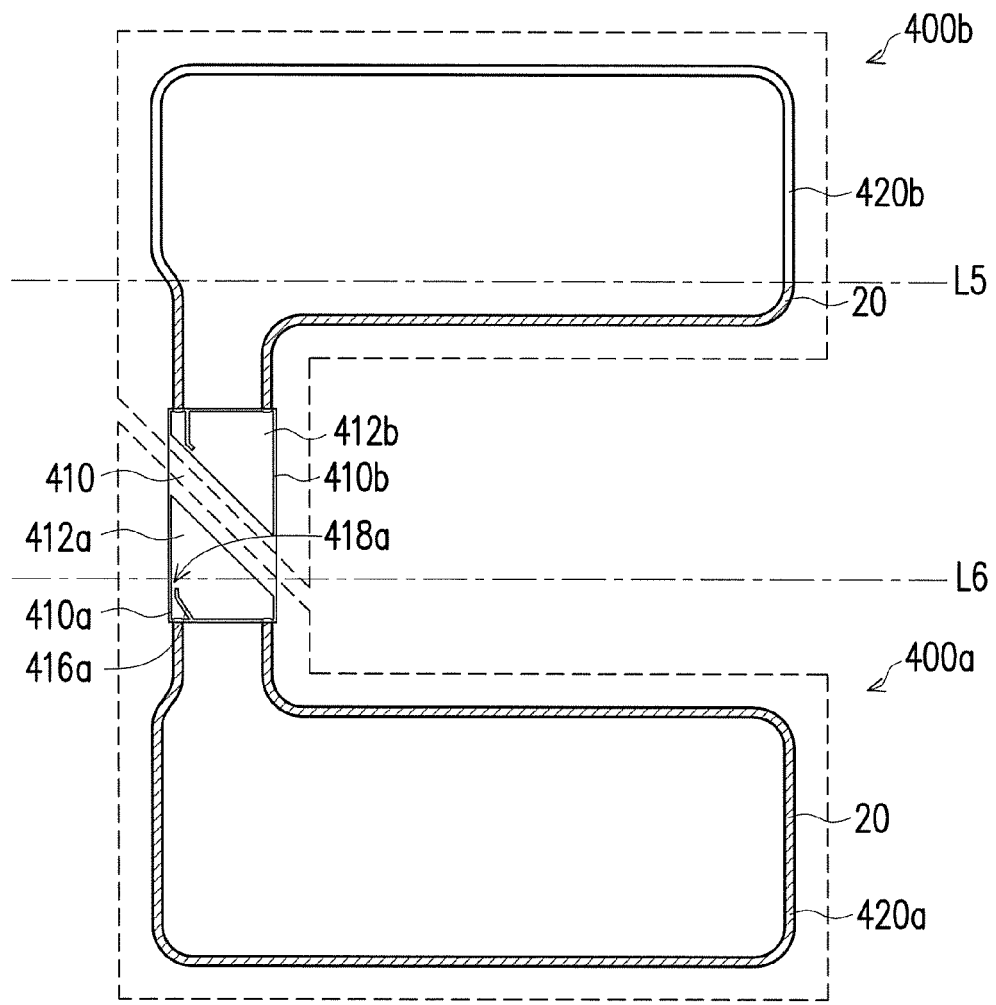
FIG. 6 is a schematic view of the cycling heat dissipation module of FIG. 5B in use.

FIG. 6 is a schematic view of the cycling heat dissipation module of FIG. 5B in use. Referring to FIG. 5A and FIG. 6, in FIG. 5A, the liquid line L5, L6 show the liquid height of the fluid 20 respectively filling the cycling heat dissipation modules 400a, 400b. When the cycling heat dissipation modules 400a, 400b are horizontal (as shown in FIG. 2B), the fluid 20 fills the main body and part of the conducting pipes 420a, 420b. This ensures that the fluid 20 can undergo a one way cycle in gas-liquid manner. In the embodiment, the volume of the fluid 20 is over 30% of the total volume of the chamber 412a, 412b and the conducting pipe 420a, 420b. Preferably, the volume of the fluid 20 is 50% of the total volume of the chamber 412a, 212b and the conducting pipe 420a, 420b. However, the invention is not limited thereto.

The amount filled by the fluid 20 can further ensure that when the cycling heat dissipation modules 400a, 400b are rotated to be upright as shown in FIG. 6, such as when the electronic device is being vertically used, the fluid 20 covers the opening of the narrow channel 418a of the first chamber 412a. In other words, fluid 20 at a lower region can continuously fill the corresponding conducting pipe 420a, and the liquid line L6 of the fluid 20 is higher the opening of the narrow channel 418a formed by the wall 416a and the chamber 412a. This allows the fluid 20 in the chamber 412a to still be able to absorb the heat of the heat guiding part 414 after the heat guiding part 414 absorbs the heat from the heat generating element 12, and undergo evaporation and enter the conducting pipe 420a for cooling.

Based on the above, in the cycling heat dissipation module of the invention, the fluid flows in the chamber of the main body. The heat guiding part of the main body can absorb the heat generated from a heat generating element, and conduct the heat to the fluid. After the fluid absorbs the heat generated from the heat generating element, the fluid is evaporated and exits the main body from the first outlet of the first compartment and enters the heat exchanging section. The fluid is cooled and condensed in the heat exchanging section, and is then returned to the main body by flowing into the second compartment through the first inlet. The fluid in the second compartment can permeate through the porous wall and enter to first compartment to continue absorbing heat. It can also pass through the narrow channel formed by the wall and the side of the chamber to flow into the first compartment. Thus, the fluid forms a fluid cycle and continuously flows in the conducting pipe.

Thus, the cycling heat dissipating apparatus of the invention can reduce the volume of a water-cooled heat dissipating system, so as to be more suitable for a thinner notebook computer or tablet PC. Regardless of how the electronic device is operated, the fluid of the conducting pipes can be higher than the wall or opening of the narrow channel. Thus, the fluid motion is maintained. In addition, the cycling heat dissipation module of the embodiment uses the fluid to absorb the heat transmitted to the heat guiding part, and then evaporate to create a fluid cycle. This further reduces the noise problem of heat dissipation.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A cycling heat dissipation module, adapted to remove heat generated by a heat generating element of a circuit board, the cycling heat dissipation module comprising:
    at least one main body, comprising:
        at least one chamber, disposed in the at least one main body, wherein the chamber is filled with a fluid and includes a wall, so as to divide the chamber into a first compartment and a second compartment adjacent with each other, wherein the first compartment has a first outlet, and the second compartment has a first inlet; and
        a heat guiding part, contacted with at least one first side wall of the chamber, wherein the heat guiding part is used for conducting the heat generated from the heat generating element; and
    at least one conducting pipe, having a first end, a second end, and a heat exchanging section, wherein the first end is connected to the first outlet, the second end is connected to the first inlet, and the heat exchanging section is connected to the first end and the second end;
    wherein after the fluid in the first compartment absorbs the heat conducted from the at least one first side wall, the fluid is pushed into the heat exchanging section through the first outlet by a pressure difference, and after the fluid is cooled, the fluid is then pushed back into the second compartment through the first inlet by a pressure difference.

2. The cycling heat dissipation module as claimed in claim 1, wherein a volume of the fluid is over 30% of a total volume of the chamber and the conducting pipe.

3. The cycling heat dissipation module as claimed in claim 2, wherein a volume of the fluid is 50% of a total volume of the chamber and the conducting pipe.

4. The cycling heat dissipation module as claimed in claim 1, wherein the first side wall and a bottom side wall of the chamber connected with the first side wall forms an angle.

5. The cycling heat dissipation module as claimed in claim 4, wherein when a first cycling heat dissipation module and a second cycling heat dissipation module are arranged in parallel, the first side wall and the bottom side wall of the first cycling heat dissipation module form an acute angle, and the first side wall and the bottom side wall of the second cycling heat dissipation module form an obtuse angle.

6. The cycling heat dissipation module as claimed in claim 1, further comprising an extension element, wherein the heat guiding part includes a concave containing the extension element, and the extension element contacts the heat generating element, so that the heat generated from the heat generating element is conducted to the heat guiding part.

7. The cycling heat dissipation module as claimed in claim 1, wherein the wall is composed of heat conductive porous material, so that the fluid in the second compartment permeates through the wall to enter the first compartment.

8. The cycling heat dissipation module as claimed in claim 1, where in the porous material is sintered metal powder, etched metal, weaved metal, or weaved non-metal fiber.

9. The cycling heat dissipation module as claimed in claim 1, wherein when the cycling heat dissipation module is in an upright condition, the fluid in the chamber covers over the wall of the chamber.

10. The cycling heat dissipation module as claimed in claim 1, wherein the first side wall includes a plurality of trenches, the trenches are located below the heat guiding part, and are communicated with the first compartment.

11. The cycling heat dissipation module as claimed in claim 1, wherein the wall of the chamber is extruded from a second side wall opposite to the at least one first side wall, and forms a narrow channel with a side wall of the chamber, connecting the first compartment and the second compartment, allowing the fluid in the second compartment to enter the first compartment through the narrow channel.

12. The cycling heat dissipation module as claimed in claim 11, wherein a cross sectional area of the second compartment gradually shrinks as the second compartment is connected closer to the narrow channel.

13. The cycling heat dissipation module as claimed in claim 11, wherein when the cycling heat dissipation module is in an upright condition, the fluid in the chamber covers the narrow channel in the chamber.

* * * * *